United States Patent
Petrofsky et al.

(10) Patent No.: US 6,501,329 B1
(45) Date of Patent: Dec. 31, 2002

(54) ADAPTIVE FILTERING FOR IMPROVED RMS-TO-DC SIGNAL CONVERSION

(75) Inventors: Joseph G. Petrofsky, Cupertino, CA (US); Robert C. Dobkin, Monte Sereno, CA (US)

(73) Assignee: Linear Technology Corporation, Milpitas, CA (US)

( * ) Notice: Subject to any disclaimer, the term of this patent is extended or adjusted under 35 U.S.C. 154(b) by 22 days.

(21) Appl. No.: 09/713,908

(22) Filed: Nov. 16, 2000

(51) Int. Cl.$^7$ ................................................ H03K 5/00
(52) U.S. Cl. ...................... 327/552; 708/322
(58) Field of Search .............................. 327/552, 551, 327/100; 708/317, 318, 322

(56) References Cited

U.S. PATENT DOCUMENTS

| | | | | |
|---|---|---|---|---|
| 4,905,101 A | * | 2/1990 | Ohta et al. | 341/110 |
| 5,698,984 A | * | 12/1997 | Little et al. | 324/601 |
| 5,784,304 A | * | 7/1998 | Koike | 364/724.19 |
| 6,154,547 A | * | 11/2000 | Whitecar | 381/94.2 |

OTHER PUBLICATIONS

A CMOS Delta–Sigma True RMS Converter, by Wey and Huang, IEEE Journal of Solid–State Circuits, vol. 35, No. 2, pp. 248–257, Feb. 2000.

Thermal Techniques in Measurement and Control Circuitry, by Jim Williams, Linear Technology Application Note 5, Dec. 1984.

Clock–Tunable, High Accuracy, Quad 2nd Order, Analog Filter Building Blocks, by Philip Karantzalis, Linear Technology Magazine, vol. VIII, No. 3, pp. 8–10, Aug. 1998.

A 200MB/s Analog DFE Read Channel, by Sands et al., Proceedings of the ISSCC, paper 4.6, pp. 72, 73, and 421, Feb. 8, 1996.

RMS to DC Conversion Application Guide, by Kitchin and Counts, 2nd Edition, Analog Devices, Inc., 1986.

Nonlinear Circuits Handbook, edited by Daniel H. Sheingold, 2nd Edition, Analog Devices, Inc., pp. 389–416, Jan. 1976.

* cited by examiner

*Primary Examiner*—Dinh T. Le
(74) *Attorney, Agent, or Firm*—Fish & Neave; Garry J. Tuma; Peter F. Snell

(57) ABSTRACT

Adaptive filters are presented that dynamically adjust the level of filtering of signals output from a sigma-delta or noise-shaping pulse code modulator RMS-to-DC converter to efficiently remove noise to improve accuracy without unduly increasing conversion response time. The level of filtering is adjusted in accordance with criteria responsive to either input signal changes (e.g., variance), input signal frequency, or both. Filtering can be analog or digital.

48 Claims, 6 Drawing Sheets

ADAPTIVE FILTERING FOR IMPROVED RMS-TO-DC SIGNAL CONVERSION

BACKGROUND OF THE INVENTION

This invention relates to root-mean-square to direct current (RMS-to-DC) signal conversion. More particularly, this invention relates to the filtering of outputs from RMS-to-DC converters that use a sigma-delta modulator.

The RMS value of a signal waveform is the "effective" value of that waveform. In other words, it is the equivalent DC value that has the same effect as a varying waveform. For example, a sinusoidal voltage waveform having a peak value of 163 volts has an RMS value of about 115 volts. This means that a DC voltage of 115 volts delivers to a resistive load the same power as a sinusoidal voltage having a peak value of 163 volts. RMS measurements allow all types of voltage (and current) waveforms to be compared to one another. Mathematically, the RMS value of a signal V is defined as:

$$V_{rms} = \sqrt{\overline{V^2}} \qquad (1)$$

which means that the RMS value of V is the square root of the mean (average) squared value of V (the overbar in equation (1) represents the average value), and is thus referred to as the "root-mean-square" of V. For sinusoids, the RMS value is 0.707 of the peak value.

Many RMS-to-DC signal conversions involve sampling (i.e., measuring) an analog input signal a specified number of times per second. This is known as the sampling frequency. Outputs of sigma-delta RMS-to-DC converters (and those using other pulse code modulators) typically include quantization noise that can affect the accuracy of the RMS measurement. Quantization is the process of measuring an analog event at a sample time and assigning a numerical value to that measured event. Quantization noise is the difference between the actual analog value at sample time and the quantization value, and generally increases as the analog input signal frequency increases. Quantization noise can also increase when other signal characteristics increase (e.g., amplitude) or change notably (e.g., sine wave to square wave).

A conventional way to deal with this noise is to filter it from the output signal. At low input signal frequencies (relative to the sampling frequency), quantization noise is typically low and therefore requires less filtering to produce accurate RMS results. At high input signal frequencies (relative to the sampling frequency), or upon increases or notable changes in other input signal characteristics, quantization noise is typically not only high, but may be substantial. In these cases, more filtering should be performed to produce accurate RMS results.

The level of filtering, however, affects the response time of the RMS-to-DC conversion process. For example, high levels of filtering, which are preferable when quantization noise is high, result in slow response times. Low levels of filtering, which are preferable when quantization noise is low, result in fast response times. Accordingly, RMS-to-DC conversion involves a trade-off between output signal accuracy (i.e., level of filtering) and response time.

A disadvantage of conventional RMS-to-DC conversion processes is that they are typically limited to a fixed level of noise filtering. Thus, the accuracy versus response time trade-off is probably not optimized for more than one input signal frequency. The likely result is that in some cases response time may be unnecessarily slow because unnecessary filtering is being performed, and in other cases RMS values may be unnecessarily inaccurate because insufficient filtering is being performed.

In view of the foregoing, it would be desirable to provide adaptive filtering of sigma-delta based RMS-to-DC converter outputs in which filter response characteristics are dynamically adjusted in accordance with pre-established accuracy versus response time trade-offs.

It would also be desirable to provide adaptive filtering of sigma-delta based RMS-to-DC converter outputs in which filter response characteristics are dynamically adjusted in response to input signal changes.

It would further be desirable to provide adaptive filtering of sigma-delta based RMS-to-DC converter outputs in which filter response characteristics are dynamically adjusted in response to input signal frequency changes.

It would still further be desirable to provide adaptive filtering of sigma-delta based RMS-to-DC converter outputs such that accurate RMS measurements of very high frequency input signals can be made without adverse noise affects and undue response time increases.

It would yet further be desirable to provide both digital and analog adaptive filtering of sigma-delta based RMS-to-DC converter outputs.

SUMMARY OF THE INVENTION

It is an object of this invention to provide adaptive filtering of sigma-delta based RMS-to-DC converter outputs in which filter response characteristics are dynamically adjusted in accordance with pre-established accuracy versus response time trade-offs.

It is also an object of this invention to provide adaptive filtering of sigma-delta based RMS-to-DC converter outputs in which filter response characteristics are dynamically adjusted in response to input signal changes.

It is a further object of this invention to provide adaptive filtering of sigma-delta based RMS-to-DC converter outputs in which filter response characteristics are dynamically adjusted in response to input signal frequency changes.

It is still a further object of this invention to provide adaptive filtering of sigma-delta based RMS-to-DC converter outputs such that accurate RMS measurements of very high frequency input signals can be made without adverse noise affects and undue response time increases.

It is yet a further object of this invention to provide both digital and analog adaptive filtering of sigma-delta based RMS-to-DC converter outputs.

In accordance with this invention, an adaptive filter circuit is provided that filters an electrical signal representing an RMS-to-DC signal conversion of an analog input signal. The representative signal can be, for example, the output signal of an RMS-to-DC converter or the output signal of an analog-to-digital converter (ADC) fed by an RMS-to-DC converter. The filter circuit selects a level of filtering in accordance with criteria that is responsive to at least one signal derived from the analog input signal. The derived signal can be, for example, the output signal of an RMS-to-DC converter, the output signal of an ADC fed by an RMS-to-DC converter, or a signal containing frequency information pertaining to the input signal, such as, for example, the output signal of a frequency counter having the analog input signal as an input. The adaptive filter circuit filters the representative signal in accordance with the selected level of filtering. Embodiments of the present invention include both analog and digital adaptive filtering. Advantageously, the adaptive filter circuit of the present invention dynamically adjusts its response characteristics (e.g., level of filtering and resulting response time) in response to the analog input signal's characteristics.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

Figure 1:
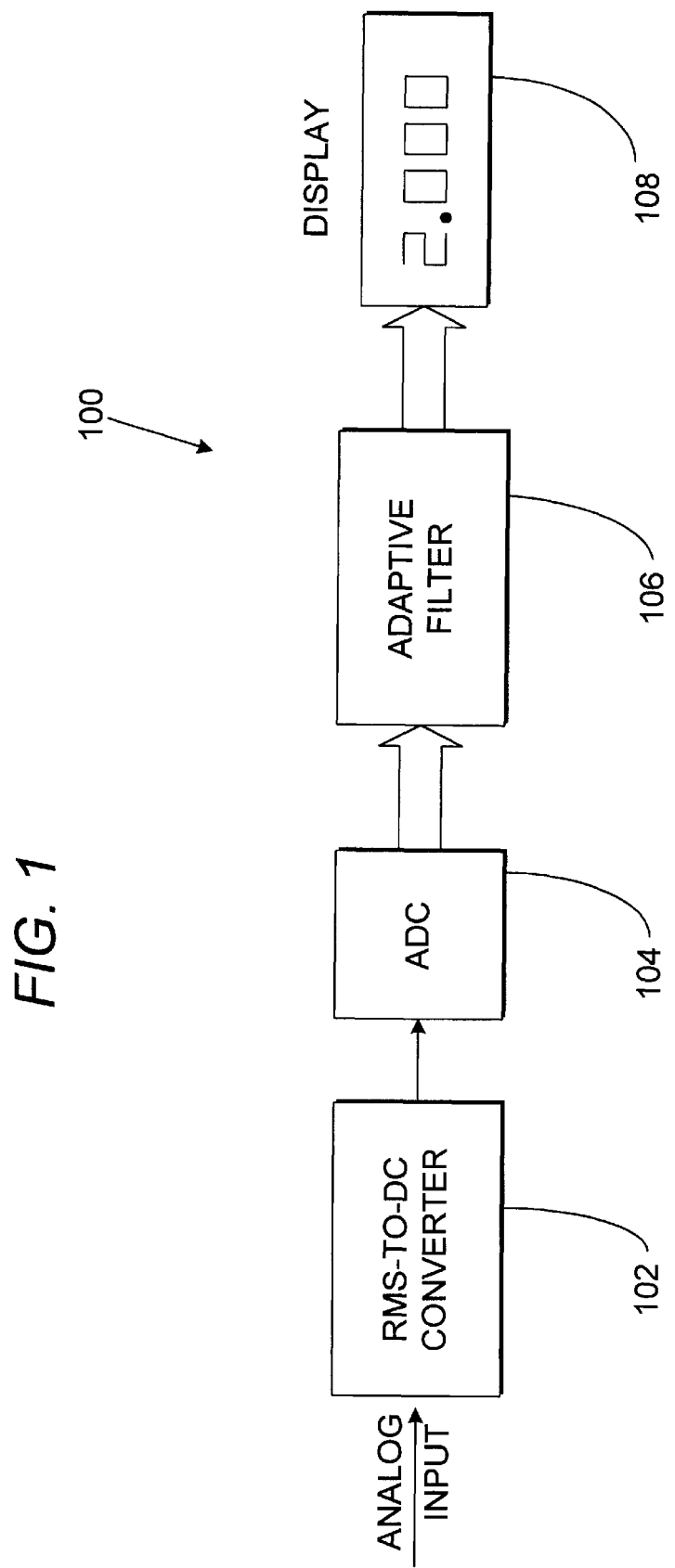
FIG. 1 is a representational block diagram of a typical system application incorporating an adaptive filter of the present invention.

Root-mean-square to direct current (hereinafter and in the claims "RMS-to-DC") signal conversion is used primarily in measurement instrumentation. FIG. 1 shows a typical system application in which the present invention is incorporated in a digital AC (alternating current) meter. AC meter 100 includes RMS-to-DC converter 102, which converts the analog input signal to an RMS DC value. Converter 102 preferably uses a sigma-delta modulator or a noise-shaping pulse code modulator. The output of converter 102 is fed to analog-to-digital converter (ADC) 104. The digital output of ADC 104 is coupled preferably to adaptive filter 106, which provides a filtered digital signal to digital display 108. Digital display 108 displays the measured RMS value of the analog input signal.

Figure 2:
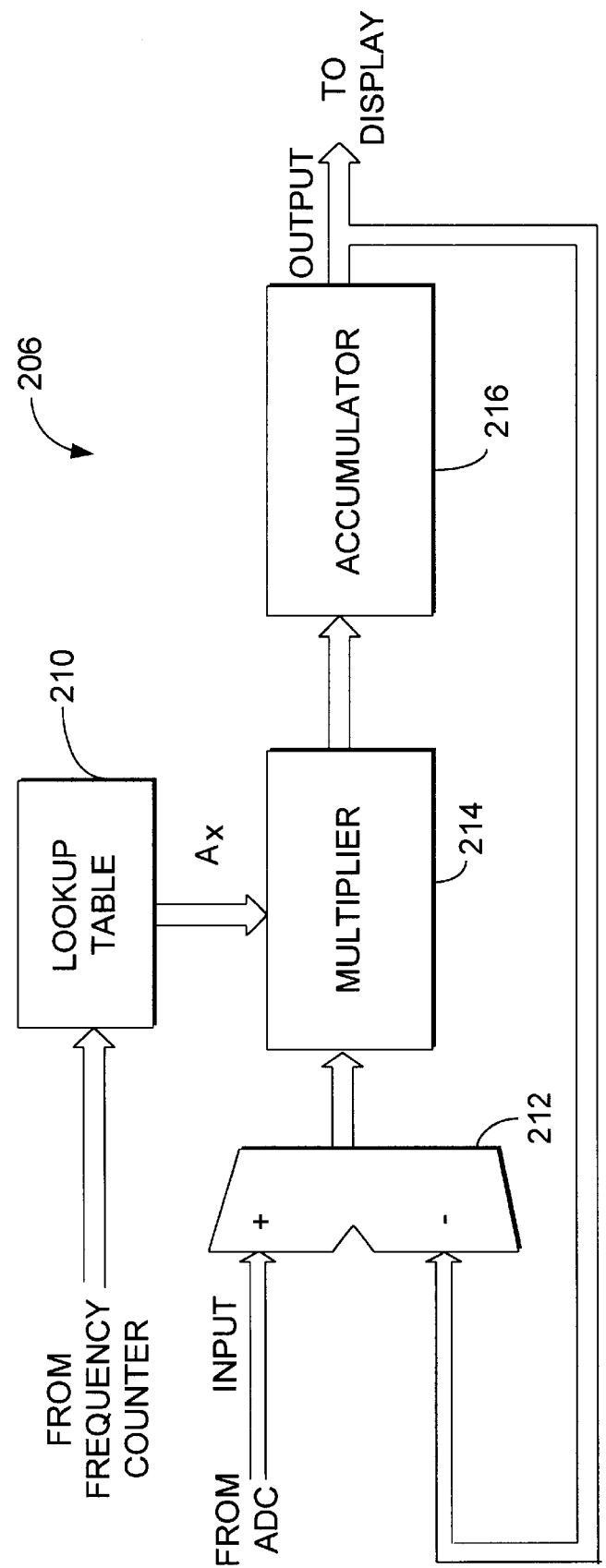
FIG. 2 is a representational block diagram of an exemplary embodiment of an adaptive digital filter in accordance with the present invention.

FIG. 2 shows an exemplary embodiment of an adaptive filter in accordance with the present invention. The adaptive filter provides digital filtering of a signal representing an RMS-to-DC signal conversion. The level of filtering provided by adaptive filter 206 is based preferably on the frequency of the analog input signal.

Adaptive filter 206 preferably includes look-up table (LUT) 210, which receives an input signal containing frequency information pertaining to the analog input signal. Preferably, the input of LUT 210 is the output of a typical frequency counter that has as its input the analog input signal. Entries in LUT 210 preferably include a plurality of frequencies that the analog input signal may have and a corresponding plurality of constants $A_x$. Each constant $A_x$ represents a level of filtering and corresponds to a respective frequency entry. Accordingly, the output of LUT 210 is a constant $A_x$ that corresponds to the frequency entry associated with the received frequency of the analog input signal. Alternatively, instead of a plurality of frequencies, LUT 210 can include a plurality of another relevant signal characteristic that would correspond to the plurality of filtering level constants. For example, LUT 210 can include a plurality of input signal magnitude changes, each corresponding to a respective filtering constant. Moreover, LUT 210 alternatively can be replaced with other means of selecting filtering constants, such as, for example, a comparator that compares a received input signal characteristic to a threshold.

Adaptive filter 206 also includes digital subtractor 212, multiplier 214, and accumulator 216. An accumulator adds its output to its input each time it is activated and is a common digital signal processing element, as are the LUT, subtractor, and multiplier. The non-inverting input of subtractor 212 receives a digital signal (i.e., multiple-bit digital data) representing the RMS-to-DC conversion of an analog input signal, such as that from ADC 104. The inverting input of subtractor 212 receives the output of accumulator 216, which is also a digital signal. The outputs of subtractor 212 and LUT 210 are fed to multiplier 214. Multiplier 214's output is coupled to accumulator 216. The output of accumulator 216 is the digitally filtered output of adaptive filter 206 and can be fed to, for example, a digital display.

Note that selected constant $A_x$ is effectively a filter time constant having a value preferably greater than zero and less than or equal to one. If the output of LUT 210 were replaced with a fixed constant A, adaptive filter 206 simply becomes a first order, infinite-impulse-response (IIR) low-pass filter. However, with LUT 210, the response of the IIR filter is adaptively adjusted in accordance with the constant $A_x$ corresponding to the received frequency of the input signal. Furthermore, in a digital multi-meter, a frequency counter may already exist, thus the incorporation of adaptive filter 206 into such an RMS-to-DC conversion process can be advantageously cost effective.

Figure 3:
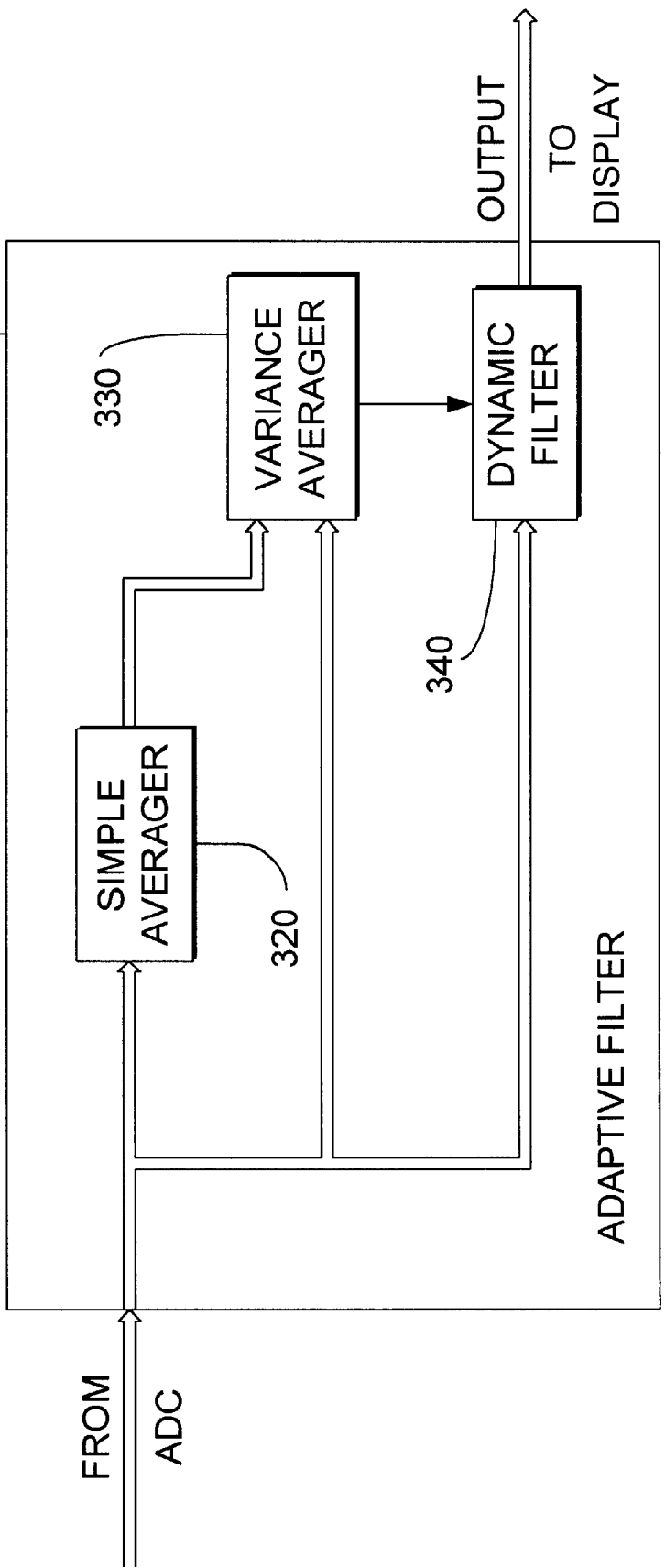
FIG. 3 is a representational block diagram of another exemplary embodiment of an adaptive digital filter in accordance with the present invention.

FIG. 3 shows another exemplary embodiment of an adaptive digital filter in accordance with the present invention. Adaptive filter 306 preferably includes three digital filtering blocks 320, 330, and 340. Filter block 320 is preferably a simple averager, filter block 330 is preferably a variance averager, and filter block 340 is preferably a dynamic filter. Note that these blocks can be implemented as three discrete circuits, any combination of discrete or integrated circuits, a single integrated circuit, or as part of a more functionally complex integrated or discrete circuit.

Adaptive filter 306 operates preferably as follows: simple averager 320 averages a plurality of digitized outputs from an ADC to determine an average magnitude of the outputs. The input of the ADC is preferably the output of an RMS-to-DC converter having as its input an analog input signal. The average magnitude is subtracted at variance averager 330 from the magnitude of a most recently received digitized ADC output to determine a difference. That difference is compared to a threshold to select a level of filtering (e.g., a filter time constant). The selected level of filtering is then fed to dynamic filter 340, which filters the ADC output accordingly.

Figure 4:
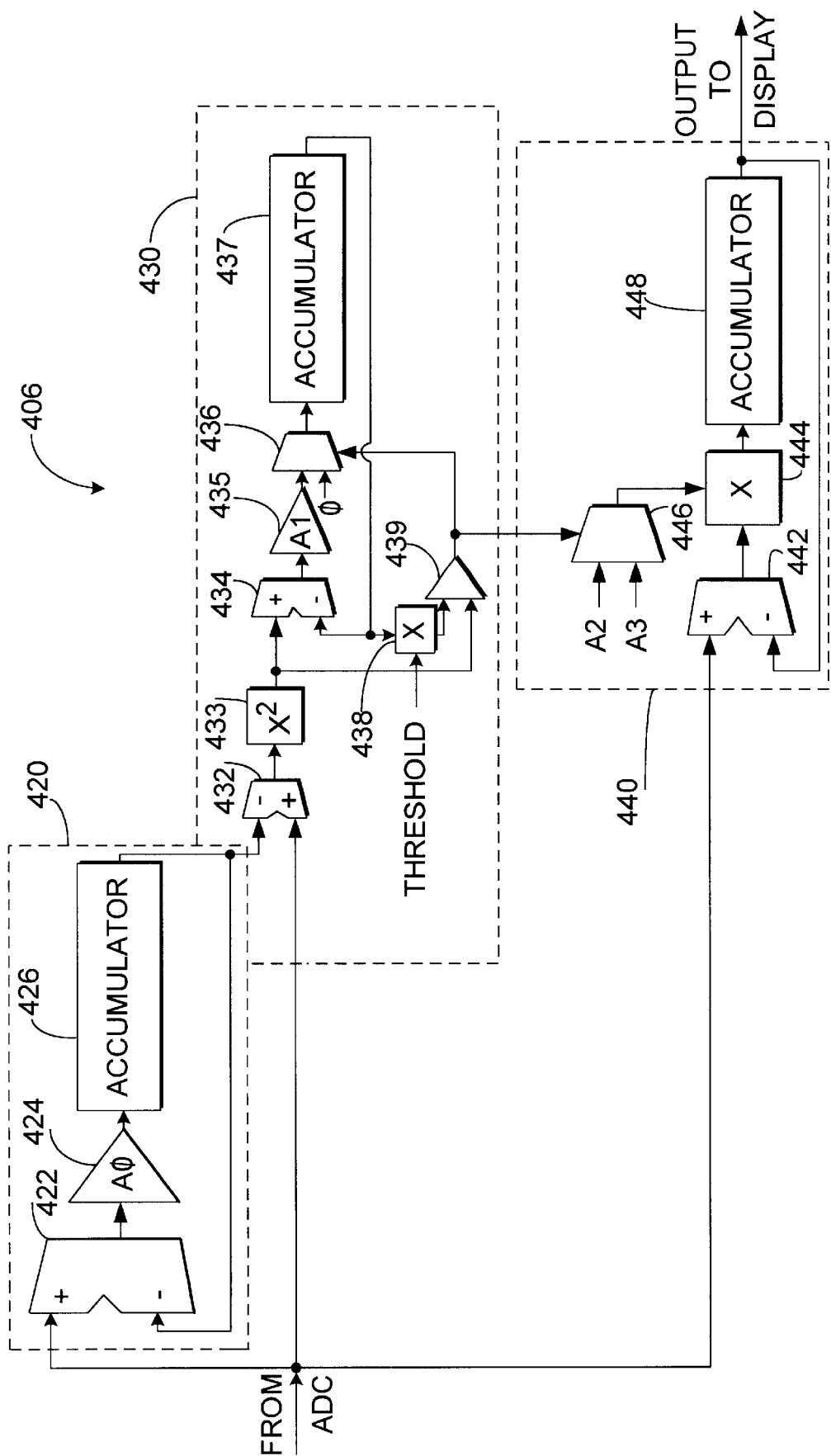
FIG. 4 is a more detailed representational block diagram of an exemplary embodiment of the adaptive digital filter of FIG. 3 in accordance with the present invention.

FIG. 4 shows a more detailed exemplary embodiment of an adaptive digital filter in accordance with the present invention. Adaptive filter 406 preferably has at least two operational modes—a normal mode and a fast mode—and is responsive to changes in the analog input signal as represented by an ADC output signal. Adaptive filter 406 preferably includes simple averager 420, variance averager 430, and dynamic filter 440. Note that although connections between and within averagers 420 and 430 and filter 440 are shown as simple lines for clarity, they each represent connections of multiple-bit digital data (except the output of comparator 439, which is single-bit). Furthermore, averagers 420 and 430 and filter 440 can be implemented as described above with respect to filtering blocks 320, 330, and 340.

Simple averager 420 is preferably configured as a first order IIR filter with a fixed response. The ADC output is coupled to the non-inverting input of digital subtractor 422. The inverting input of subtractor 422 is coupled to the output of accumulator 426. The output of subtractor 422 is scaled by a gain of AØ (which is preferably greater than zero and less than or equal to one) at attenuator 424 and fed to accumulator 426. The output of accumulator 426 is the simple average of the ADC output and is fed to variance averager 430.

Variance averager 430 includes digital subtractor 432, which receives the simple ADC output average at its inverting input. The ADC output is received at subtractor 432's non-inverting input. The output of subtractor 432 is coupled to squarer 433, which squares its input. Note that the squaring function allows the inputs of subtractor 432 to be reversed without affecting the output of squarer 433. The output of squarer 433 is coupled to the non-inverting input of another digital subtractor 434, whose inverting input is coupled to the output of accumulator 437. The output of subtractor 434 is scaled by a gain of A1 at attenuator 435 and then fed to a 2:1 multiplexer 436. The other input to multiplexer 436 is preferably zero, but alternatively can be another value as described below. The output of multiplexer 436 is coupled to accumulator 437. The output of accumulator 437 is the variance average and is coupled to the input of multiplier 438. The other input of multiplier 438 is coupled to a threshold. The output of multiplier 438 is coupled to one input of digital comparator 439, whose other input is coupled to the output of squarer 433. The output of comparator 439 is coupled to the control terminal of multiplexer 436 and to the control terminal of a 2:1 multiplexer 446 of dynamic filter 440.

Dynamic filter 440 preferably includes digital subtractor 442 whose non-inverting input receives the ADC output signal and whose inverting input receives the output of accumulator 448. The output of subtractor 442 is coupled to multiplier 444, which also receives the output of multiplexer 446. Multiplexer 446 receives two data inputs, constants A2 and A3, and is controlled by the output of comparator 439 of variance averager 430. Constants A2 and A3 are effectively filter time constants. For example, if A2 is greater than A3, less filtering is performed when A2 is fed to multiplier 444, thus decreasing response time and causing filter 406 to operate in fast mode. Conversely, when A3 is fed to multiplier 444, more filtering is performed, thus increasing response time and causing filter 406 to operate in normal mode. Multiplexer 446 can be alternatively constructed to receive more than two data s inputs, thus providing additional levels of filtering (i.e., additional operational modes). The output of multiplier 444 is coupled to accumulator 448. The output of accumulator 448 is the digitally filtered output of adaptive filter 406 and can be fed to, for example, a digital display.

Adaptive filter 406 compares the input sample variance to a running average of the variance. The variance is calculated by subtracting the ADC output from the output of simple averager 420 and then squaring the difference at squarer 433. The squared result is then averaged in a simple IIR low-pass filter. The operational mode of dynamic filter 440 is then adjusted when the input variance exceeds a given threshold. To compare the present sample variance to the running average, the running average is multiplied by the threshold and then fed to comparator 439. Advantageously, no dividers or square root functions are required, which typically increase circuit complexity, power consumption, and cost. The threshold is preferably a value whose square root represents the number of standard deviations to which responses are preferably adapted.

For example, to adaptively respond to variances exceeding three standard deviations, a threshold of nine should be used. To adaptively respond to variances exceeding four standard deviations, a threshold of 16 should be used. Assuming a Gaussian noise distribution, four standard deviations occur only 0.006% of the time. Thus, for example, a static RMS input value on a multi-meter whose ADC samples the RMS-to-DC output every 100 msec (a common sampling rate because it provides a null for both 50 and 60 Hz), will likely have random noise falsely trip the adaptive threshold once every 0.1/0.00006=16,667 seconds, or once every 28 minutes. This should be acceptable for a general-purpose multi-meter. A threshold of four standard deviations is also advantageous for digital signal processing because multiplier 438 can be alternatively replaced with a simple hardwired (i.e., fixed) shift-left-by-four-bits logic connection. Such hardwired logic connections are possible where a multiplier input is a power of two.

Dynamic filter 440 operates as a simple first-order IIR low-pass filter except that its time constant can be switched between the two constants, A2 and A3. As described above, adaptive filter 406 accordingly operates in two modes: a normal mode in which filter 406 smoothens out the noise of an RMS-to-DC conversion, and a fast mode. In fast mode, less filtering is performed thus permitting a quicker transient response than in normal mode. This is preferable when large rapid signal changes occur relative to the present noise level. Such signal changes are detected by variance averager 430's threshold comparator 439. Less filtering and improved response times are preferable in these cases because such signal changes are not likely caused by increased noise, but by true changes in the input signal.

Note that when such large rapid signal changes occur, the variance average computed by variance averager 430 will also change comparably quickly. To prevent such changes from inflating the variance average too quickly, and therefore causing filter 406 to revert to normal mode too soon, threshold comparator 439 disables further variance averaging by causing multiplexer 436 to feed a zero into accumulator 437 during slewing. Alternatively, feeding a small value into accumulator 437 instead of a zero may be desirable for those cases in which filter 406 should-switch back to normal mode somewhat more quickly (but not as quickly as with gain A1). This can be accomplished by either replacing the zero input to multiplexer 436 with a small constant, or by switching from gain A1 to a smaller value gain. To be able to switch gains, attenuator 435 and multiplexer 436 can be replaced with a multiplexer and multiplier, similar to the arrangement of multiplexer 446 and multiplier 444 of dynamic filter 440.

Preferably, constant AØ is less than constants A2 and A3. This allows simple averager 420 to maintain a running average over a longer period of time (and thus respond more slowly to rapid input signal changes) than that computed and maintained by variance averager 430.

Figure 5:
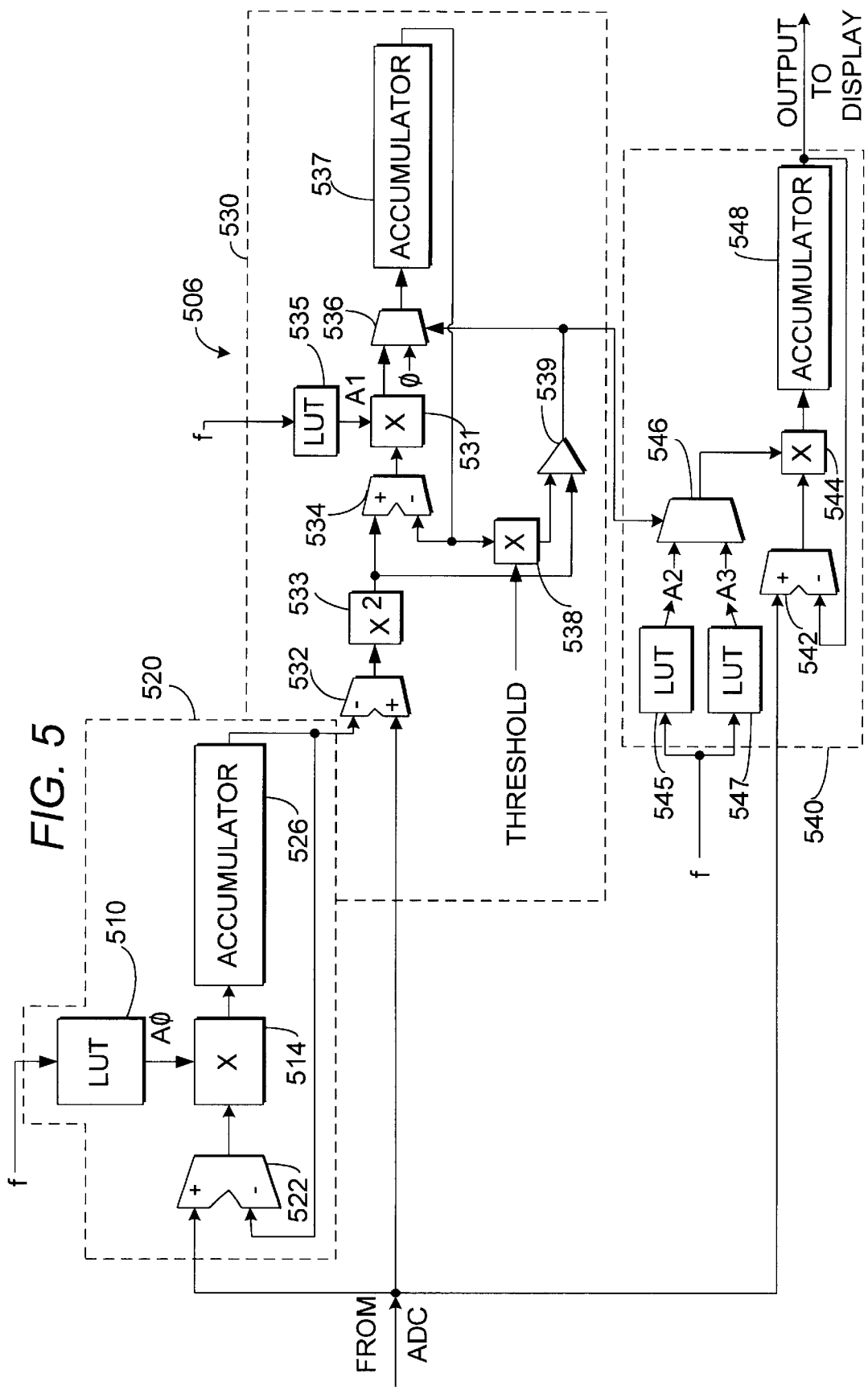
FIG. 5 is a representational block diagram of another exemplary embodiment of an adaptive digital filter in accordance with the present invention.

FIG. 5 shows another exemplary embodiment of an adaptive digital filter in accordance with the present invention. Adaptive filter 506 uses both input signal frequency and RMS signal variance thresholding to select a level of filtering. Each constant (i.e., scale factor) controlling the filter response characteristics of filter 506 (i.e., AØ, A1, A2, and A3) is adjustable in-circuit. Preferably, each is generated by a respective LUT whose addressing is controlled by the input signal frequency, similar to the operation of LUT 210.

Adaptive filter 506 is similar to filter 406 except as follows: LUT 510 and multiplier 514 replace attenuator 424 of FIG. 4. Similarly, LUT 535 and multiplier 531 replace attenuator 435, and LUTs 545 and 547 respectively provide selected values for A2 and A3. Each LUT receives input signal frequency information, preferably from a typical frequency counter, and outputs a corresponding value for that LUT's respective scale factor. Other parameters may also be controlled by an LUT, such as a selectable constant instead of the zero at multiplexer 536, as mentioned above. Accordingly, operation of filter 506 is determined by both changes in noise (as represented by input signal frequency) and changes in input signal characteristics (as represented by variance thresholding in variance averager 530).

In an alternative embodiment of adaptive filter 506 (not shown), frequency inputs to LUTs 510, 535, 545, and 547 can be replaced by the output of accumulator 537, because that output represents the present input signal noise level. However, this embodiment is less preferable than that shown in FIG. 5.

Note that in adaptive filters 206, 306, 406, and 506, digital multipliers 214, 444, 514, 531, and 544 can be each alternatively replaced with a barrel shifter provided that the received filter constant is a power of two. The received filter level constant determines the amount of shift applied to the received input. Barrel shifters are less complex and less costly than multipliers and thus may be advantageous in many applications. Furthermore, multipliers 424, 435, 438, and 538 can be each alternatively replaced with a hardwired (fixed) logic shift connection provided that the received filter constant or threshold is a power of two. Such fixed connections consume less power and are less complex and less costly than multipliers, and thus may be also advantageous in many applications.

Advantageously, adaptive filters 106, 206, 306, 406, and 506 need not be implemented as fixed hardware (i.e., dedicated circuits). Because RMS-to-DC responses are typically limited by a low frequency low-pass filter, the ADC that samples the RMS output need not operate very fast. Accordingly, the data rate can be very low. For example, a sampling rate of 100 msec constitutes a data rate of just 10 Hz. The adaptive filters of the present invention can therefore be economically implemented within a small, low-power, general-purpose micro-controller. only a small portion of the available processing bandwidth is needed. Registers or other memory locations can replace the accumulators. Subtractions can be performed in a single arithmetic logic unit (ALU) with a set of software instructions that in effect time-multiplex the operation of the ALU. The same can be done for the other computational elements, such as the multipliers and the squarer. LUTs can be implemented by setting aside dedicated areas of memory. Alternatively, LUTs can be replaced by an appropriate algorithm that generates the desired constants from received input signal information (e.g., input signal frequency).

Advantageously, programmable logic devices, such as FPGAs (field programmable gate arrays), also can be used to implement the adaptive digital filters of the present invention.

Although the adaptive digital filters of the present invention have been described with respect to first order IIR filtering, they are not limited as such. For example, finite-impulse-response filtering and second and third order IIR filtering can be used in the adaptive filters of the present invention.

Figure 6:
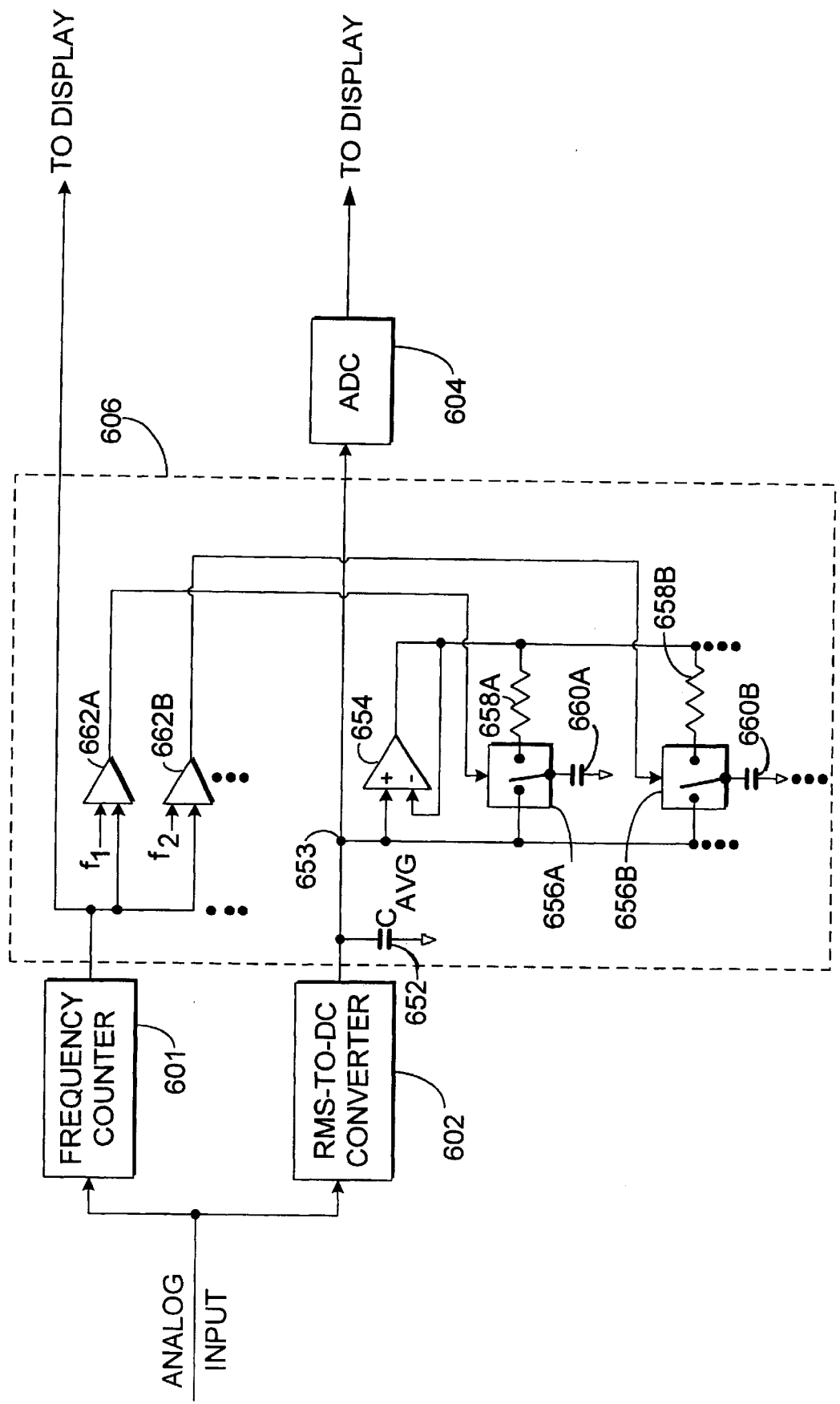
FIG. 6 is a representational block circuit diagram of an exemplary embodiment of an adaptive analog filter in accordance with the present invention.

FIG. 6 shows an exemplary embodiment of an adaptive analog filter in accordance with the present invention. Adaptive analog filter 606 includes an averaging capacitor 652 coupled to the output of an RMS-to-DC converter 602. Converter 602 preferably uses a sigma-delta modulator or a noise-shaping pulse code modulator. The output of converter 602 is coupled to ADC 604. Note that capacitor 652 need not be coupled to converter 602's output node, but alternatively can be coupled to, for example, an output of a filter or filter and buffer fed by converter 602. Adaptive filter 606 also preferably includes optional operational amplifier (op-amp) 654, which has its non-inverting input coupled to capacitor 652 as shown. The inverting input of op-amp 654 is coupled to its output, and as such operates as a unity gain buffer. Thus, op-amp 654 can be alternatively replaced with such a buffer. The output of op-amp 654 is coupled to a plurality of optional resistors 658 (shown in FIG. 6 as resistors 658A and 658B) that are coupled to a respective plurality of analog switches 656 (shown in FIG. 6 as switches 656A and 656B). Switches 656 are preferably single pole, double-throw switches. One terminal of each switch 656 is coupled to a capacitor 660 (shown in FIG. 6 as capacitors 660A and 660B), and another terminal is coupled to node 653. The second terminal of each capacitor 660, and of averaging capacitor 652, is coupled preferably to ground, but can be coupled instead to another reference voltage (e.g., supply voltage). The number of capacitor circuits (i.e., switch 656, optional resistor 658, and capacitor 660) determines the number of selectable levels of filtering that filter 606 can provide.

The value of each capacitor 660 is preferably unique within filter 606. Preferably, the values of capacitors 660 are multiples of each other. For example, capacitor 660A preferably has the same value as averaging capacitor 652, capacitor 660B preferably has a value twice that of averaging capacitor 652, capacitor 660C (not shown) preferably has a value four times that of averaging capacitor 652, and so on.

Switches 656 are preferably controlled by a plurality of comparators 662 (shown in FIG. 6 as comparators 662A and 662B), each of which compares a fixed threshold (e.g., f1 or f2) to frequency information preferably received from a frequency counter 601 that has as its input the analog input signal being converted to an RMS value. Alternatively to comparators 662, a single time-multiplexed comparator can be used. Also alternative to comparators 662, LUTs can be used to control switches 656.

The number of switches 656 coupled to node 653 (the output of RMS converter 602) sets the level of filtering performed on the RMS converter output signal, and accordingly sets the filter response time. Adaptive analog filter 606 couples additional capacitance in parallel with averaging capacitor 652 to provide progressively higher levels of filtering in accordance with the thresholding applied to the analog input signal's frequency. Optional op-amp 654 maintains capacitor voltage equal to that of averaging capacitor 652 to reduce the transient effect as switches 656 change state. Optional resistors 658 provide stability to op-amp 654.

In an alternative embodiment of adaptive filter 606 (not shown), op-amp 654 and resistors 658 can be eliminated, and switches 656 can be replaced with single pole, single-throw switches that open and close the connection to node 653. Such an embodiment, however, is less preferable than that shown in FIG. 6.

Thus it is seen that adaptive filtering is provided for signals representing an RMS-to-DC signal conversion to improve RMS output signal accuracy without unduly increasing conversion response time. One skilled in the art will appreciate that the present invention can be practiced by other than the described embodiments, which are presented for purposes of illustration, and not of limitation, and the present invention is limited only by the claims which follow.

We claim:

1. An adaptive filter circuit operative to filter an electrical signal representing an RMS-to-DC signal conversion of an analog input signal, said adaptive filter circuit comprising:
    a circuit operative to receive at least one signal derived from said analog input signal, said derived signal indicating a frequency of said analog input signal or a magnitude of said representative signal, said circuit also operative to select a level of filtering based on said frequency, said magnitude, or both; and
    a filter circuit that filters said representative signal in accordance with said selected level of filtering.

2. The adaptive filter circuit of claim 1 wherein said representative signal comprises an output signal from an RMS-to-DC converter having said analog input signal as an input.

3. The adaptive filter circuit of claim 1 wherein said representative signal comprises an output signal from an analog-to-digital converter.

4. The adaptive filter circuit of claim 3 wherein said analog-to-digital converter has an input signal from an output of an RMS-to-DC converter that has said analog input signal as an input.

5. The adaptive filter circuit of claim 1 wherein said derived signal comprises said representative signal.

6. The adaptive filter circuit of claim 1 wherein said derived signal indicates said frequency of said analog input signal.

7. The adaptive filter circuit of claim 1 wherein said derived signal comprises an output signal from a frequency counter having said analog input signal as an input.

8. The adaptive filter circuit of claim 1 wherein said circuit operative to select a level of filtering receives first and second derived signals, said first derived signal comprising said representative signal and said second derived signal comprising an output signal from a frequency counter having said analog input signal as an input.

9. The adaptive filter circuit of claim 1 wherein said circuit operative to select a level of filtering comprises a lookup table in which a plurality of frequencies correspond respectively to a plurality of filtering levels.

10. The adaptive filter circuit of claim 1 wherein said circuit operative to select a level of filtering comprises:
    means for computing and maintaining a running average of magnitude of said representative signal; and
    means for comparing to a threshold a difference between said running average and a most recently received magnitude of said representative signal; wherein:
        said level of filtering is selected in accordance with an outcome of said comparison.

11. The adaptive filter circuit of claim 1 wherein said circuit operative to select a level of filtering comprises a comparator operative to receive a signal indicative of said analog input signal frequency and a threshold to which said signal is compared, said comparator outputting a control signal indicative of a level of filtering.

12. The adaptive filter circuit of claim 1 wherein said filter circuit comprises:
    a digital subtractor having an output, a positive input, and a negative input, said positive input operative to receive said representative signal;
    a digital multiplier having an input coupled to said output of said subtractor, a second input operative to receive said filter level, and an output; and
    an accumulator having an input coupled to said multiplier output and an output, said output coupled to said negative input of said subtractor, said output providing a filtered said representative signal.

13. The adaptive filter circuit of claim 1 wherein said filter circuit comprises:
    a digital subtractor having an output, a positive input, and a negative input, said positive input operative to receive said representative signal;
    a barrel shifter having an input coupled to said output of said subtractor, a second input operative to receive said filter level, and an output, said filter level indicating an amount of shift to be performed on said subtractor output; and
    an accumulator having an input coupled to said barrel shifter output and an output, said output coupled to said negative input of said subtractor, said output providing a filtered said representative signal.

14. The adaptive filter circuit of claim 1 wherein said filter circuit comprises:
    a capacitor coupled between a first node and a reference voltage, said first node coupled to receive said representative signal; and
    a plurality of capacitor circuits each comprising:
        a switch having first and second terminals, said first terminal coupled to said first node; and
        a capacitor coupled between said second switch terminal and said reference voltage; wherein
        each said switch is controlled by said circuit that selects a level of filtering.

15. The adaptive filter circuit of claim 14 wherein each said switch of said filter circuit has a third terminal, said switch operative to switch between said first and second terminals and said first and third terminals, said filter circuit further comprising a buffer having an input coupled to said first node and an output coupled to said third switch terminal.

16. The adaptive filter circuit of claim 15 wherein said buffer comprises an op-amp having a non-inverting input coupled to said first node, an output coupled to said third switch terminal, and an inverting input coupled to said op-amp output.

17. The adaptive filter circuit of claim 16 wherein each capacitor circuit further comprises a resistor coupled in series between said third switch terminal and said op-amp output.

18. The adaptive filter circuit of claim 14 wherein said circuit that selects a level of filtering comprises a comparator operative to receive a signal indicative of said analog input signal frequency and a threshold to which said signal is compared, said comparator controlling at least one said switch.

19. The adaptive filter circuit of claim 14 wherein said reference voltage is ground.

20. The adaptive filter circuit of claim 14 wherein each capacitor of said plurality of capacitor circuits has a different value.

21. The adaptive filter circuit of claim 14 wherein each value of each capacitor of said plurality of capacitor circuits is a multiple of another value of one of said capacitors.

22. The adaptive filter circuit of claim 1 wherein said level of filtering comprises a filter time constant.

23. A method of adaptively filtering an electrical signal representing an RMS-to-DC signal conversion of an analog input signal, said method comprising:

receiving said representative signal;

selecting a level of filtering based on a frequency of said analog input signal, a magnitude of said representative signal, or both; and filtering said received representative signal in accordance with said selected level of filtering.

24. The method of claim 23 wherein said representative signal comprises an output signal from an RMS-to-DC converter having said analog input signal as an input.

25. The method of claim 23 wherein said representative signal comprises an output signal from an analog-to-digital converter.

26. The method of claim 25 wherein said analog-to-digital converter has an input signal from an output of an RMS-to-DC converter that has said analog input signal as an input.

27. The method of claim 23 further comprising receiving a signal indicating said frequency of said analog input signal.

28. The method of claim 23 further comprising receiving an output signal from a frequency counter having said analog input signal as an input.

29. The method of claim 23 wherein said selecting a level of filtering is based on said frequency of said analog input signal.

30. The method of claim 23 wherein said selecting a level of filtering is based on both said magnitude of said received representative signal and said frequency of said analog input signal.

31. The method of claim 23 wherein said selecting a level of filtering comprises using a lookup table that includes a plurality of frequencies corresponding respectively to a plurality of levels of filtering.

32. The method of claim 23 wherein said level of filtering comprises a filter time constant.

33. The method of claim 23 wherein said level of filtering is higher for said analog input signal having a high frequency than for said analog input signal having a low frequency.

34. The method of claim 23 wherein said selecting a level of filtering comprises selecting a level from a plurality of levels corresponding respectively to a plurality of frequencies, said selected level corresponding to said frequency of said analog signal.

35. The method of claim 23 wherein said level of filtering is lower for said received representative signal having a rapid high change in magnitude in comparison to an average of previously received magnitudes of said representative signal.

36. The method of claim 23 wherein said selecting a level of filtering comprises:

averaging a plurality of magnitudes of said received representative signal to determine an average magnitude;

subtracting said averaged magnitude from a most recently received magnitude of said representative signal to determine a difference;

comparing said difference to a threshold; and selecting a level of filtering in accordance with an outcome of said comparing.

37. The method of claim 23 wherein said filtering comprises digitally filtering said received representative signal in accordance with said selected level of filtering.

38. The method of claim 23 wherein said filtering comprises analog filtering of said received representative signal in accordance with said selected level of filtering.

39. The method of claim 23 wherein said selecting a level of filtering comprises selecting a number of parallel capacitors to be coupled to said received representative signal based on said frequency of said analog input signal.

40. The method of claim 39 wherein said selected number is zero.

41. An adaptive filter circuit operative to filter an electrical signal representing an RMS-to-DC signal conversion of an analog input signal, said adaptive filter circuit comprising:

a circuit operative to receive at least one signal derived from said analog input signal, said derived signal indicating a frequency of said analog input signal or a magnitude of said representative signal, said circuit also operative to select a level of filtering based on said frequency, said magnitude, or both, said circuit comprising a lookup table in which a plurality of frequencies correspond respectively to a plurality of filtering levels; and a filter circuit that filters said representative signal in accordance with said selected level of filtering.

42. An adaptive filter circuit operative to filter an electrical signal representing an RMS-to-DC signal conversion of an analog input signal, said adaptive filter circuit comprising:

a circuit operative to receive at least one signal derived from said analog input signal, said derived signal indicating a frequency of said analog input signal or a magnitude of said representative signal, said circuit also operative to select a level of filtering based on said frequency, said magnitude, or both, said circuit comprising a lookup table in which a plurality of frequencies correspond respectively to a plurality of filtering levels;

a digital subtractor having an output, a positive input, and a negative input, said positive input operative to receive said representative signal;

a digital multiplier having an input coupled to said output of said subtractor, a second input operative to receive a selected filter level, and an output; and an accumulator having an input coupled to said multiplier output and an output, said output coupled to said negative input of said subtractor, said output providing a filtered said representative signal.

43. An adaptive filter circuit operative to filter an electrical signal representing an RMS-to-DC signal conversion of an analog input signal, said adaptive filter circuit comprising:

a circuit operative to receive at least one signal derived from said analog input signal, said derived signal indicating a frequency of said analog input signal or a magnitude of said representative signal, said circuit also operative to select a level of filtering based on said frequency, said magnitude, or both, said circuit comprising a comparator operative to receive a signal indicative of said analog input signal frequency and a threshold to which said signal is compared, said comparator outputting a control signal indicative of a level of filtering; and a filter circuit that filters said representative signal in accordance with said selected level of filtering.

44. An adaptive filter circuit operative to filter an electrical signal representing an RMS-to-DC signal conversion of an analog input signal, said adaptive filter circuit comprising:

a circuit operative to receive at least one signal derived from said analog input signal, said derived signal indicating a frequency of said analog input signal or a magnitude of said representative signal, said circuit also operative to select a level of filtering based on said frequency, said magnitude, or both, said circuit comprising a comparator operative to receive a signal indicative of said analog input signal frequency and a threshold to which said signal is compared, said comparator outputting a control signal indicative of a level of filtering; and a filter circuit that filters said representative signal in accordance with said selected level of filtering, said filter circuit comprising:
 a capacitor coupled between a first node and a reference voltage, said first node coupled to receive said representative signal; and
 a plurality of capacitor circuits each comprising:
  a switch having first and second terminals, said first terminal coupled to said first node; and
  a capacitor coupled between said second switch terminal and said reference voltage; wherein
  each said switch is controlled by said circuit that selects a level of filtering.

45. An adaptive filter circuit operative to filter an electrical signal representing an RMS-to-DC signal conversion of an analog input signal, said adaptive filter circuit comprising:
 means for receiving said representative signal;
 means for selecting a level of filtering based on a frequency of said analog input signal, a magnitude of said representative signal, or both; and
 means for filtering said received representative signal in accordance with said selected level of filtering.

46. An adaptive filter circuit operative to filter an electrical signal representing an RMS-to-DC signal conversion of an analog input signal, said adaptive filter circuit comprising:

circuit means to receive at least one signal derived from said analog input signal, said derived signal indicating a frequency of said analog input signal or a magnitude of said representative signal, said circuit means selecting a level of filtering based on said frequency, said magnitude, or both; and filter circuit means for filtering said representative signal in accordance with said selected level of filtering.

47. A method of adaptively filtering an electrical signal representing an RMS-to-DC signal conversion of an analog input signal, said method comprising:
 receiving said representative signal;
 selecting a level of filtering based on a frequency of said analog input signal, said selected level of filtering higher for said analog input signal having a high frequency than for said analog input signal having a low frequency; and
 filtering said received representative signal in accordance with said selected level of filtering.

48. A method of adaptively filtering an electrical signal representing an RMS-to-DC signal conversion of an analog input signal, said method comprising:
 receiving said representative signal;
 selecting a level of filtering based on a magnitude of said representative signal, said selected level of filtering lower for said received representative signal having a rapid high change in magnitude in comparison to an average of previously received magnitudes of said representative signal; and
 filtering said received representative signal in accordance with said selected level of filtering.

* * * * *